United States Patent
Jou et al.

(10) Patent No.: US 10,838,001 B2
(45) Date of Patent: Nov. 17, 2020

(54) BUMP BALL TESTING SYSTEM AND METHOD

(71) Applicant: TAIWAN SEMICONDUCTOR MANUFACTURING COMPANY, LTD., Hsinchu (TW)

(72) Inventors: Chewn-Pu Jou, Hsinchu (TW); Min-Jer Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/518,355

(22) Filed: Jul. 22, 2019

(65) Prior Publication Data

US 2019/0339324 A1 Nov. 7, 2019

Related U.S. Application Data

(63) Continuation of application No. 14/815,038, filed on Jul. 31, 2015, now Pat. No. 10,379,156.

(60) Provisional application No. 62/168,475, filed on May 29, 2015.

(51) Int. Cl.
 *G01R 31/28* (2006.01)

(52) U.S. Cl.
 CPC ..... *G01R 31/2853* (2013.01); *G01R 31/2856* (2013.01); *G01R 31/2884* (2013.01)

(58) Field of Classification Search
 CPC ............ G01R 31/2853; G01R 31/2856; G01R 31/2884
 USPC ..................................................... 324/750.3
 See application file for complete search history.

(56) References Cited

U.S. PATENT DOCUMENTS

| | | | |
|---|---|---|---|
| 6,025,730 A | 2/2000 | Akram | |
| 6,452,502 B1 | 9/2002 | Dishongh | |
| 6,630,832 B1 | 10/2003 | Harzanu | |
| 6,867,608 B2 | 3/2005 | Richmond, II | |
| 7,501,832 B2 | 3/2009 | Spuhler | |
| 7,557,596 B2 | 7/2009 | Eldridge | |
| 8,448,100 B1 | 5/2013 | Lin et al. | |
| 8,580,088 B2 | 11/2013 | Haishi | |

(Continued)

OTHER PUBLICATIONS

Liu et al. ("A new method for fabricating ultrathin metal films as scratch-resistant flexible transparent electrodes"; Published Apr. 1, 2015; Journal of Materiomics 1; [2015] 52-59, herein Liu).

*Primary Examiner* — Nasima Monsur
*Assistant Examiner* — Rahul Maini
(74) *Attorney, Agent, or Firm* — Hauptman Ham, LLP (57) ABSTRACT

An integrated circuit testing system is provided that includes a conductive line connected to a node configured to have a ground voltage. A plurality of conductive structures are coupled to the conductive line. A plurality of test circuits each is configured to supply a test voltage individually to a different conductive structure of the plurality of conductive structures for testing electrical connectivity of each of the different conductive structures. The conductive line is positioned between the node and the test circuits of the plurality of test circuits. A controller is coupled to each of the test circuits of the plurality of test circuits. The controller is configured to cause each of the test circuits of the plurality of test circuits to individually supply the test voltage to each of the different conductive structures of the plurality of conductive structures.

20 Claims, 10 Drawing Sheets

(56) References Cited

U.S. PATENT DOCUMENTS

| | | | |
|---|---|---|---|
| 8,631,372 B2 | 1/2014 | Yu et al. | |
| 8,669,780 B2 | 3/2014 | Chi | |
| 8,701,073 B1 | 4/2014 | Fu et al. | |
| 8,749,254 B2 | 6/2014 | Su | |
| 8,754,818 B2 * | 6/2014 | Yen | H01L 25/0652 |
| | | | 343/702 |
| 9,024,315 B2 | 5/2015 | Yao | |
| 9,111,895 B2 | 8/2015 | Pagani | |
| 9,329,227 B2 | 5/2016 | Xie | |
| 2007/0200571 A1 | 8/2007 | Quinn | |
| 2009/0066358 A1 * | 3/2009 | Smayling | G01R 31/2858 |
| | | | 324/750.3 |
| 2011/0242781 A1 * | 10/2011 | Funayama | G01R 31/2853 |
| | | | 361/782 |
| 2013/0193981 A1 | 8/2013 | Chen et al. | |
| 2013/0246990 A1 | 9/2013 | Yen et al. | |
| 2013/0320553 A1 | 12/2013 | Kuo et al. | |
| 2014/0043148 A1 | 2/2014 | Wang et al. | |
| 2014/0077057 A1 | 3/2014 | Chao et al. | |
| 2014/0092939 A1 | 4/2014 | Chang et al. | |
| 2014/0126089 A1 | 5/2014 | Chang et al. | |
| 2014/0126274 A1 | 5/2014 | Lee et al. | |
| 2014/0167799 A1 | 6/2014 | Wang et al. | |
| 2014/0195728 A1 | 7/2014 | Hsu et al. | |
| 2014/0203397 A1 | 7/2014 | Yen et al. | |
| 2014/0211438 A1 | 7/2014 | Lin et al. | |
| 2014/0239427 A1 | 8/2014 | Huang et al. | |
| 2014/0264772 A1 | 9/2014 | Horng et al. | |
| 2014/0266273 A1 | 9/2014 | Wang et al. | |
| 2015/0019927 A1 | 1/2015 | Hsu | |
| 2015/0070046 A1 | 3/2015 | Takano | |

* cited by examiner

BUMP BALL TESTING SYSTEM AND METHOD

PRIORITY CLAIM

The present application is a continuation of U.S. application Ser. No. 14/815,038, filed Jul. 31, 2015, which claims the priority of U.S. Provisional Application No. 62/168,475, filed May 29, 2015, which are incorporated herein by reference in their entireties.

BACKGROUND

Integrated circuits (IC's) sometimes include bump ball interconnection structures. The bump ball interconnection structures are usually included in IC's to provide electrical connections between various features of the IC. Sometimes, the bump ball interconnection structures are used to provide electrical connections between the IC and an external device or other integrated circuit. Manufacturing defects sometimes result in a bump ball interconnection structure being incapable of providing a designed electrical connection. For example, sometimes a bump ball interconnection structure is manufactured in a manner or damaged by a testing mechanism that results in a failed electrical connection. As such, some IC testing systems and methods provide ways to test whether a bump ball interconnection structure is capable of carrying a voltage. Some IC testing systems and methods use complicated and expensive test pins or probes to test for electrical connectivity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Integrated circuits (ICs) sometimes include bump ball interconnection structures. The bump ball interconnection structures are usually included in ICs to provide electrical connections between various features of the IC. Sometimes, the bump ball interconnection structures are used to provide electrical connections between the IC and an external device or other integrated circuit. Testing whether the bump ball interconnection structures are properly manufactured such that the bump ball interconnection structures provide a designed electrical connectivity is often difficult because the bump ball interconnection structures have curved surfaces.

Some IC test systems and methods use complex test pins like pogo pins or cobra pins that have flexible mechanical structures. The flexible mechanical structures are intended to provide a way to contact the curved surface of the bump ball interconnection structure. Pogo pins and cobra pins; however, sometimes mar the bump ball interconnection structure, which degrades the reliability of the bump ball interconnection structure.

In some embodiments, bump ball interconnection structures are spaced from one another by at least 100 micrometers. As ICs are designed with a greater quantity of input/output pins, and as the overall size of ICs and various components thereof such as complementary metal oxide semiconductor (CMOS) transistors decrease, the distance between bump ball interconnection structures decreases. In some embodiments, the distance between bump ball interconnection structures is less than 100 micrometers.

Test pins (also referred to as test probes) with flexible mechanical structures, such as pogo pins and cobra pins, are difficult to fabricate efficiently to test bump ball interconnection structures that are spaced from one another by less than 100 micrometers. Additionally, IC testing systems that use test pins are often expensive. For example, pogo pins include springs to enhance the flexibility of the test pin. Springs having a diameter of less than 100 micrometers are difficult to manufacture. Furthermore, a test pin that includes such a spring is difficult to assemble.

Additionally, as the distance between bump ball interconnection structures decreases, the diameter of such bump ball interconnection structures also decreases. The smaller the diameter of the bump ball interconnection structure, the more susceptible the bump ball interconnection structure is to marring or other structural blemishes that reduce the effectiveness of the bump ball interconnection structure in making an electrical connection.

To avoid contacting the bump ball interconnection structures, some IC's have contact pads that are configured to be touched with a test pin. These contact pads extend beyond the diameter of the bump ball interconnection structure such that the contact pad is capable of being touched by the test pin. In at least some embodiments, the contact pad is capable of being touched by the test pin without contacting the bump ball interconnection structure. In some embodiments, extended contact pads increase the size of the IC without an increase in the functionality of the IC.

Figure 1:
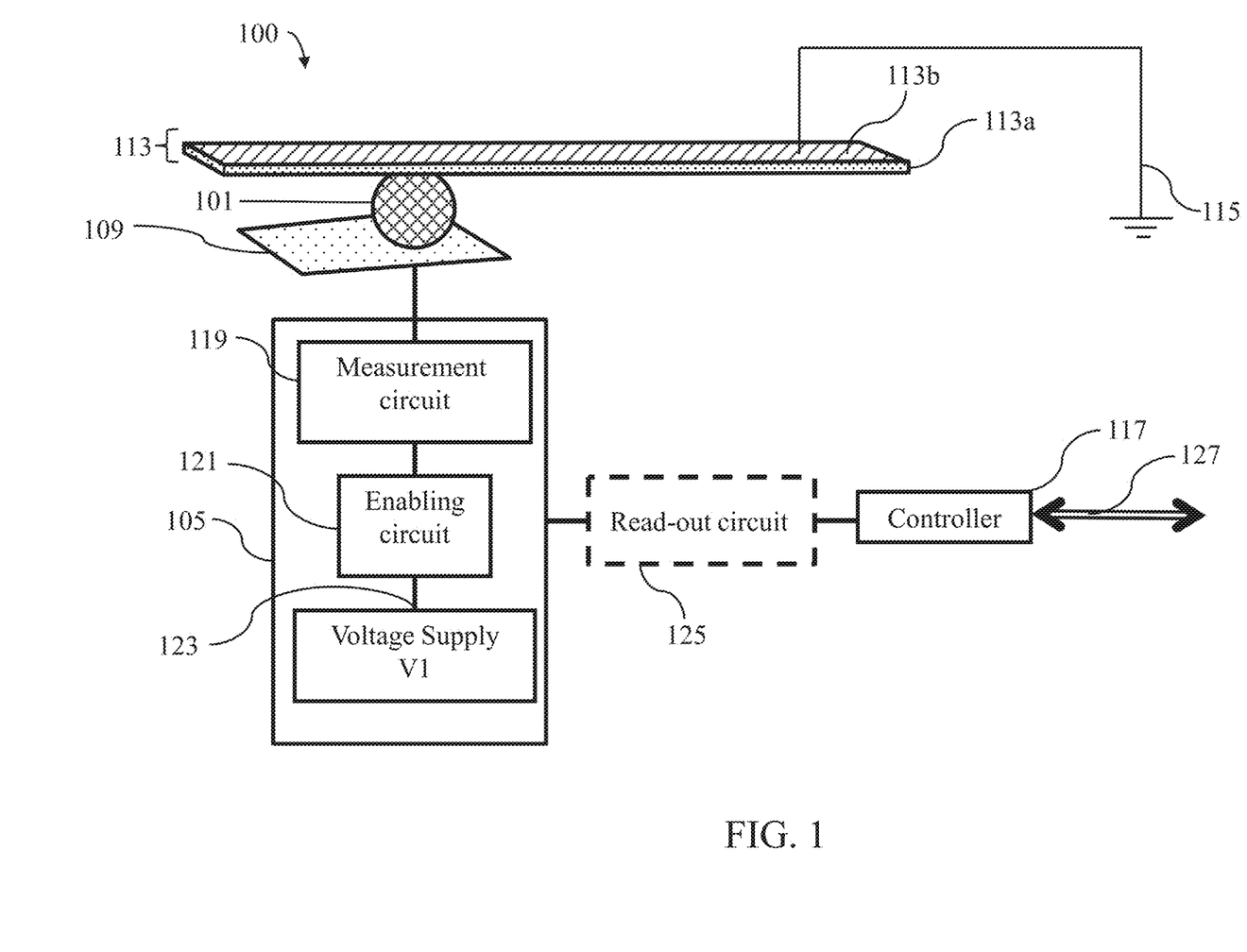
FIG. 1 is a diagram of an integrated circuit (IC) testing system, in accordance with one or more embodiments.

FIG. 1 is a diagram of an IC testing system 100, in accordance with one or more embodiments. IC testing system 100 is configured to enable the testing of the electrical connectivity of an interconnection structure without having to contact the interconnection structure with a test pin that could damage the interconnection structure. In some embodiments, IC testing system 100 is configured to test a current flow through the interconnection structure without having to contact the interconnection structure with a test pin. In some embodiments, IC testing system 100 is configured to determine whether a current flow through the interconnection structure exceeds a predetermined threshold value without having to contact the interconnection structure with a test pin.

In some embodiments, IC testing system 100 is configured to test whether an interconnection structure is capable of carrying a voltage without having to contact the interconnection structure with a test pin that could damage the interconnection structure. In some embodiments, IC testing system 100 helps to facilitate testing whether an interconnection structure is capable of carrying a voltage where interconnection structures included in the IC are spaced by distances that are less than 100 micrometers. In some embodiments, IC testing system 100 is also capable of being used to test whether an interconnection structure is capable of carrying a voltage where the interconnection structures included in the IC are spaced by distances of at least 100 micrometers.

IC testing system 100 comprises a test circuit 105 connected via a conductive pad 109 to a conductive structure 101. Test circuit 105 is configured to test electrical connectivity between the conductive structure 101 and conductive pad 109. Test circuit 105 is configured to supply a voltage to conductive structure 101 via conductive pad 109 and measure a current flow to a ground 115 connected to the conductive structure via a conductive line 113. In some embodiments, test circuit 105 is a built-in-self test circuit. In some embodiments, test circuit 105 is configured to test electrical connectivity between the conductive structure 101 and conductive line 113.

In some embodiments, conductive pad 109 is an under bump layer. In some embodiments, conductive pad 109 comprises one or more of copper, gold, aluminum or another suitable electrically conductive material.

In some embodiments, the conductive structure 101 is a bump ball. In some embodiments, the bump ball has a curved surface in contact with the conductive line 113. In some embodiments, the bump ball comprises solder. In some embodiments, the conductive structure 101 is a solder bump. In some embodiments, the conductive structure 101 is a conductive pillar. In some embodiments, the conductive structure 101 comprises one or more of copper, gold, aluminum, or another suitable electrically conductive material. In some embodiments, a distance between the conductive structure 101 and another conductive structure (not shown) is less than 100 micrometers.

Conductive structure 101 connects test circuit 105, via conductive pad 109, to a conductive line 113. In some embodiments, conductive line 113 is a conductive plane. In some embodiments, conductive line 113 is in direct physical contact with conductive structure 101. In some embodiments, conductive line 113 comprises a non-marking material capable of contacting conductive structure 101 without marring the conductive structure 101. In some embodiments, conductive line 113 comprises a flexible material. In some embodiments, conductive line 113 comprises an electrically conductive polymer. In some embodiments, conductive line 113 comprises one or more of copper, gold, aluminum, or another suitable electrically conductive material. The conductive line 113 is electrically connected to ground 115.

In some embodiments, the conductive line 113 optionally comprises a first layer 113a and a second layer 113b over the first layer 113a. The first layer 113a is a non-marking conductive material and the second layer 113b comprises a metal material electrically coupled with the ground (also referred to as ground voltage source) 115. In some embodiments, first layer 113a comprises a conductive polymer.

Test circuit 105 is also connected to a controller 117 and thereby to a bus 127. In some embodiments, controller 117 is a built-in-self test controller configured to coordinate a testing operation which tests the electrical connectivity of the conductive structure 101 to conductive pad 109. In some embodiments, controller 117 is configured to coordinate a testing operation which tests the electrical connectivity of the conductive structure 101 to conductive line 113. In some embodiments, controller 117 is configured to be responsive to a test command. In some embodiments, the controller 117 is configured to receive the test command from a computer coupled with the controller 117 by way of the bus 127. In some embodiments, the computer receives a user instruction to perform the testing operation by way of a user interaction with a user interface associated with the computer. The computer is configured to generate the test command based on the user instruction. The computer is configured to communicate the test command to the controller 117, and the controller is configured to execute the testing operation based on the test command. In some embodiments, the controller 117 is configured to execute the testing operation without receiving the test command or without the computer receiving the user instruction by way of the user input. In some embodiments, the computer is configured to issue the test command without receiving the user instruction by way of the user input or without user interaction with the computer.

The test circuit 105 comprises a voltage supply source V1, an enabling circuit 121, a measurement circuit 119, and a voltage supply node 123 connected between the voltage supply source VA and the enabling circuit 121. Voltage supply node 123 is configured to supply voltage V1 to the enabling circuit 121. The enabling circuit is electrically connected between the voltage supply node 123 and the measurement circuit 119. The measurement circuit 119 is electrically connected to the conductive structure 101 via conductive pad 109.

The enabling circuit 121 is configured to control the supply of a voltage from voltage supply node 123 to measurement circuit 119 responsive to a command from controller 117. In some embodiments, enabling circuit 121 is configured to control activation of test circuit 105 responsive to controller 117.

The measurement circuit 119 is configured to detect a current flow. In some embodiments, measurement circuit 119 is configured to detect an amount of current flow. If the detected amount of current flow meets or exceeds a predetermined current flow amount, the measurement circuit 119 generates an indication that the conductive structure 101 is electrically connected with conductive pad 109. If the detected amount of current flow fails to meet or exceed the predetermined current flow amount, the measurement circuit 119 generates an indication that the conductive structure 101 is not electrically connected with conductive pad 109. In some embodiments, measurement circuit 119 is configured to only generate an indication that the conductive structure 101 is not electrically connected with conductive pad 109. In some embodiments, measurement circuit 119 is configured to only generate an indication that the conductive structure 101 is electrically connected with conductive pad 109.

In some embodiments, measurement circuit 119 is configured to generate an indication that the conductive structure 101 is electrically connected with conductive line 113. If the detected amount of current flow meets or exceeds a predetermined current flow amount, the measurement circuit 119 generates an indication that the conductive structure 101 is electrically connected with conductive line 113. If the detected amount of current flow fails to meet or exceed the predetermined current flow amount, the measurement circuit 119 generates an indication that the conductive structure 101 is not electrically connected with conductive line 113. In some embodiments, measurement circuit 119 is configured to only generate an indication that the conductive structure 101 is not electrically connected with conductive line 113. In some embodiments, measurement circuit 119 is configured to only generate an indication that the conductive structure 101 is electrically connected with conductive line 113.

The controller 117 is configured to selectively cause the test circuit 105 to supply the voltage V1 to the conductive structure 101. To supply the voltage V1, the controller 117 is configured to selectively actuate the enabling circuit 121 in the test circuit 105 to cause the test circuit 105 to supply the voltage V1 to the conductive structure 101. In some embodiments, enabling circuit 121 comprises one or more of a transistor, a switch, or another suitable circuit usable to selectively cause a voltage to be communicated to facilitate an electrical connection. In some embodiments, the controller 117 is configured to cause the voltage V1 to match an operating voltage of a circuit associated with conductive structure 101.

The test circuit 105 is configured to provide feedback to the controller 117 indicative of whether the conductive structure 101 is electrically connected with the test circuit by way of conductive pad 109. In at least some embodiments, test circuit 105 is configured to detect a current flow from a voltage supply to conductive structure 101 which indicates electrical connection between test circuit 105 and ground 115 by way of the flow of current through conductive structure 101 and conductive line 113. In at least some embodiments, test circuit 105 is configured to generate an indication, provided to controller 117, of electrical connection between conductive structure 101 and conductive pad 109. In at least some embodiments, test circuit 105 is configured to generate an indication, provided to controller 117, of electrical connection between conductive structure 101 and conductive pad 109. In at least some embodiments, test circuit 105 is configured to generate an indication, provided to controller 117, of electrical connection between conductive structure 101 and conductive line 113.

The feedback is based on an output generated by the measurement circuit 119. For example, if the measurement circuit 119 provides feedback to the controller 117 that indicates a current flow from the test circuit 105 through the conductive structure 101 to ground via the conductive line 113, then the controller 117 is configured to determine the conductive structure 101 is electrically connected to test circuit 105. In some embodiments, measurement circuit 119 is configured to measure a current flow through the conductive structure 101 to generate the feedback indicative of electrical connectivity of the conductive structure 101.

In some embodiments, IC testing system 100 optionally includes at least one readout circuit 125 communicatively coupled with the controller 117 and the test circuit 105. Readout circuit 125 is configured to receive the feedback from the test circuit 105 to determine if the conductive structure 101 is capable of carrying the voltage V1 based on the feedback, and to communicate the determination to the controller 117. In some embodiments, readout circuit 125 is configured to receive the feedback from the test circuit 105 to determine if the conductive structure 101 is electrically connected with conductive pad 109 based on the feedback, and to communicate the determination to the controller 117. In some embodiments, readout circuit 125 is configured to receive the feedback from the test circuit 105 to determine if the conductive structure 101 is electrically connected with conductive line 113 based on the feedback, and to communicate the determination to the controller 117.

In some embodiments, the controller 117 is configured to collect the feedback from the test circuit 105 directly, and to determine if the conductive structure 101 is capable of carrying the voltage V1. In some other embodiments, the controller 117 is configured to collect the determination(s) provided from the readout circuit(s) 125. In some embodiments, the controller 117 is configured to generate a report if the feedback/determination indicates that the conductive structure 101 is incapable of carrying the voltage V1. In some embodiments, the controller 117 is configured to generate a report if the feedback/determination indicates that the conductive structure 101 is not electrically connected with conductive pad 109. In some embodiments, the controller 117 is configured to generate a report if the feedback/determination indicates that the conductive structure 101 is not electrically connected with conductive line 113. In some embodiments, the controller 117 is configured to generate a report if the feedback/determination indicates that the conductive structure 101 is capable of carrying the voltage V1. In some embodiments, controller 117 is configured to communicate the report to a computer (not shown) communicatively coupled with controller 117 by a bus 127 or other electrical or communication connection.

In some embodiments, the IC testing system 100 is configured to be used in conjunction with another full functional test of an IC that includes the conductive structure 101. Such a full functional test involves contacting the conductive pad 109 with a test pin. In some embodiments, if the full functional test is being performed, the conductive structure 101 is not being simultaneously tested (i.e., the voltage V1 is not being supplied to another conductive structure) by the IC testing system 100. During the full functional test, measurement circuit 119 is configured to be in a high output impedance state so as to not affect the full functional test of the IC.

Figure 2:
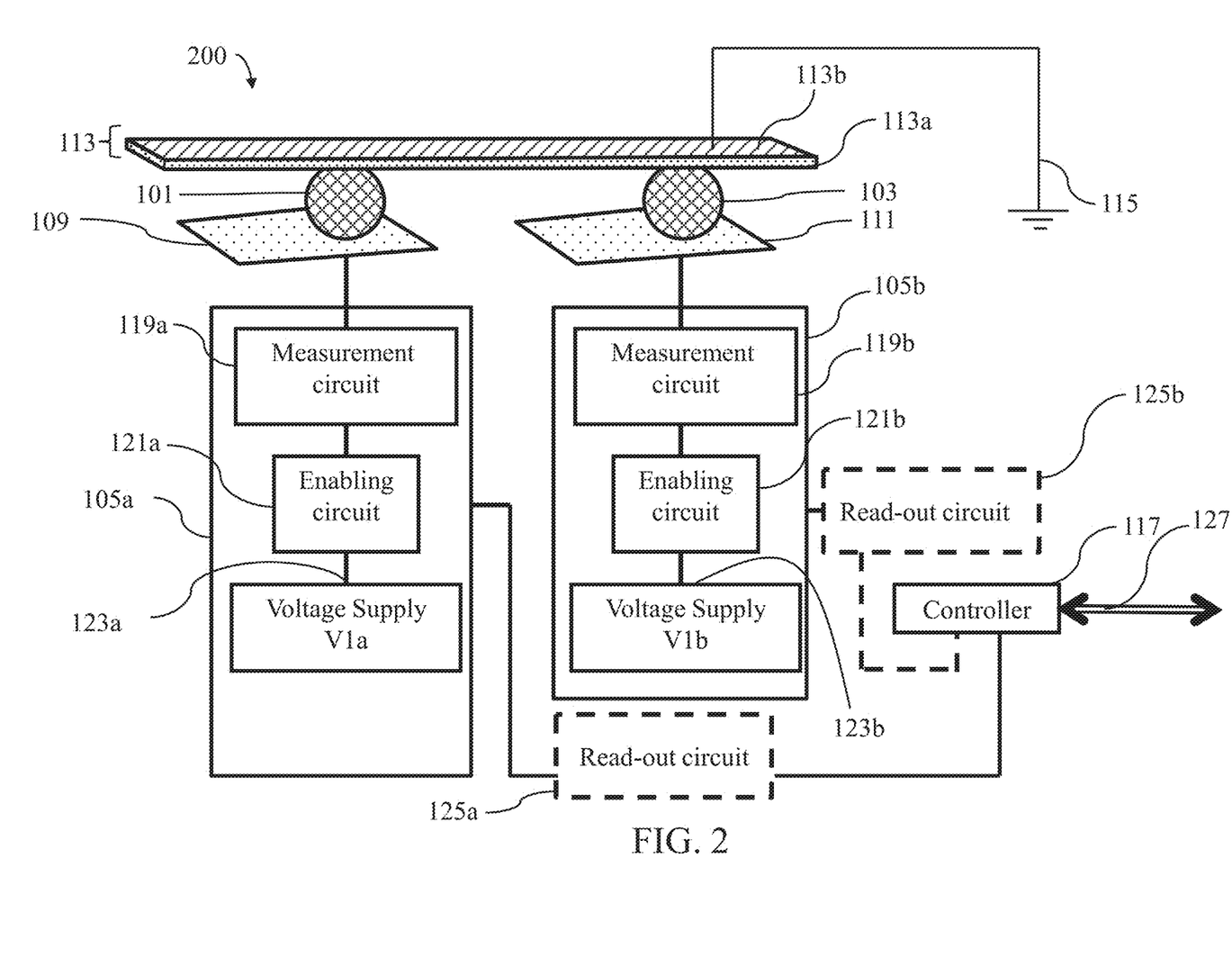
FIG. 2 is a diagram of an IC testing system, in accordance with one or more embodiments.

FIG. 2 is a diagram of an IC testing system 200, in accordance with one or more embodiments. IC testing system 200 comprises two test circuits 105a, 105b. Test circuits 105a, 105b are the same as test circuit 105 (FIG. 1). The components and operation of test circuits 105a, 105b are the same as test circuit 105 (FIG. 1) with the addition of a or b to the reference numerals as appropriate and detailed description thereof is not repeated herein for clarity. IC testing system 200 also comprises a second conductive pad 111 connecting second test circuit 105b with a second conductive structure 103. Second conductive pad 111 is the same as conductive pad 109 and second conductive structure 103 is the same as conductive structure 101. Test circuits 105a, 105b are each connected to controller 117. IC testing system 200 also optionally comprises read-out circuits 125a, 125b. Read-out circuits 125a, 125b are the same as read-out circuit 125 (FIG. 1).

In some embodiments, the conductive structures 101, 103 are spaced by distances of at least 100 micrometers. In some embodiments, the conductive structures 101, 103 are spaced by distances of less than 100 micrometers.

In some embodiments, voltage V1a differs from voltage V1b. In some embodiments, voltage V1a is equal to voltage V1b. In some embodiments, voltage supply node 123a is independent of voltage supply node 123b. In some embodiments, one or more of voltage V1 or voltage V2 is adjustable. In some embodiments, voltage supply node 123a and voltage supply node 123b are components of a voltage supply network configured to supply a test voltage (i.e., the voltage V1 and the voltage V2). In some embodiments, a single voltage supply node supplies voltage to both test circuit 105a and test circuit 105b.

The controller 117 is configured to selectively cause the test circuit 105a to supply the voltage V1a to the conductive structure 101 or to selectively cause the test circuit 105b to supply the voltage V1b to the conductive structure 103. To supply the voltage V1a or the voltage V1b, the controller 117 is configured to selectively actuate the enabling circuit 121a in the test circuit 105a or the enabling circuit 121b in the test circuit 105b to cause the test circuit 105a to supply the voltage V1a to the conductive structure 101 or the test circuit 105b to supply the voltage V1b to the conductive structure 103. In some embodiments, the controller 117 is configured to cause only one of the test circuit 105a to supply the voltage V1a or the test circuit 105b to supply the voltage V1b at a time. In some embodiments, the controller 117 is configured to selectively cause the test circuit 105a and the test circuit 105b to sequentially supply the voltage V1a and the voltage V1b in order. In some embodiments, enabling circuits 121a and 121b independently comprise one or more of a transistor, a switch, or another suitable circuit usable to selectively cause a voltage to be communicated from an input end to and output end to facilitate an electrical connection. In some embodiments, the controller 117 is configured to cause the voltage V1a or the voltage V1b to match an operating voltage of a circuit associated with conductive structure 101 or a circuit associated with conductive structure 103.

In some embodiments, IC testing system 200 optionally includes at least one readout circuit 125a communicatively coupled with the controller 117 and one or more of the test circuit 105a or the second test circuit 105b. In some embodiments, IC testing system 200 includes an additional readout circuit 125b. If IC testing system 200 includes multiple readout circuits, readout circuit 125a is communicatively coupled with test circuit 105a and with the controller 117, and readout circuit 125b is communicatively coupled with test circuit 105b and with the controller 117. Readout circuits 125a and 125b are collectively referred to as readout circuit 125 herein. Readout circuit 125 is configured to receive the feedback from the test circuit 105a or the test circuit 105b, to determine if the conductive structure 101 or the conductive structure 103 is capable of carrying the voltage V1a or the voltage V1b based on the feedback, and to communicate the determination to the controller 117.

In some embodiments, the controller 117 is configured to collect the feedback from the test circuit 105a and/or the test circuit 105b directly, and to determine if the first conductive structure 101 and/or the second conductive structure 103 is capable of carrying the voltage V1a or the second voltage V1b. Alternatively, the controller 117 is configured to collect the determination(s) provided from the readout circuit(s) 125. In some embodiments, the controller 117 is configured to generate a report if the feedback/determination indicates at least one of the conductive structure 101 or the conductive structure 103 is incapable of carrying the voltage V1a or the voltage V1b. In some embodiments, the controller 117 is configured to generate a report if the feedback/determination indicates at least one of the conductive structure 101 or the conductive structure 103 is capable of carrying the voltage V1a or the second voltage V1b. In some embodiments, the controller 117 is configured to generate a report indicating that one of the conductive structure 101 or the conductive structure 103 is incapable of carrying the voltage V1a or the voltage V1b, and the other of the conductive structure 101 or the conductive structure 103 is capable of carrying the voltage V1a or the voltage V1b. In some embodiments, controller 117 is configured to communicate the report to a computer (not shown) communicatively coupled with controller 117 by a bus 127 or other electrical or communication connection.

In some embodiments, conductive structure 101 and conductive structure 103 comprise different structure types and/or different conductive materials. For example, in some embodiments, conductive structure 101 is a bump ball and conductive structure 103 is a conductive pillar. In some embodiments, a distance between conductive structure 101 and the conductive structure 103 is less than 100 micrometers.

In some embodiments, one or more of conductive pad 109 or conductive pad 111 are under bump layers. In some embodiments, conductive pad 109 and conductive pad 111 comprise one or more of copper, gold, aluminum or another suitable electrically conductive material.

In some embodiments, conductive line 113 is in direct physical contact with one or more of the conductive structure 101 or the conductive structure 103.

In some embodiments, the IC testing system 200 is configured to be used in conjunction with another full functional test of an IC that includes the conductive structure 101 and the conductive structure 103. Such a full functional test involves contacting the conductive pad 109 or the conductive pad 111 with a test pin. In some embodiments, if the full functional test is being performed, the conductive structure 101 and the second conductive structure 103 are not being simultaneously tested (i.e., the voltage V1a or the voltage V1b is not being supplied to the conductive structure 101 or the conductive structure 103) by the IC testing system 200. During the full functional test, measurement circuit 119a and measurement circuit 119b are configured to be in a high output impedance state so as to not affect the full functional test of the IC.

Figure 3:
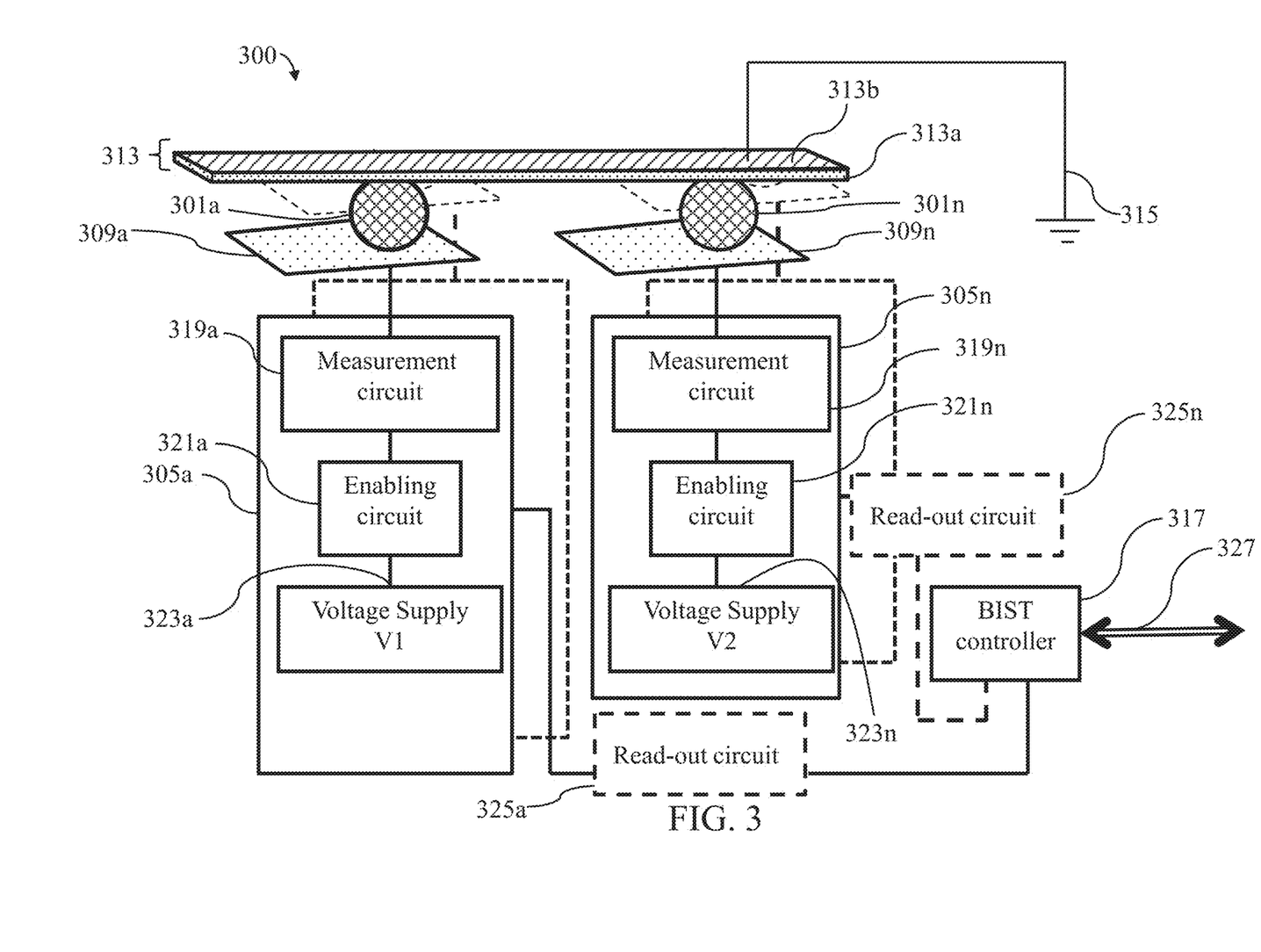
FIG. 3 is a diagram of an IC testing system, in accordance with one or more embodiments.

FIG. 3 is a diagram of an IC testing system 300, in accordance with one or more embodiments. IC testing system 300 comprises features similar to those discussed with respect to IC testing system 200 (FIG. 2), with the reference numerals increased by 200. IC testing system 300 differs from IC testing system 200 in that IC testing system 300 is a grid array that includes a plurality of conductive structures 301a-301n (collectively referred to as conductive structures 301), a plurality of test circuits 305a-305n (collectively referred to as test circuits 305), and a plurality of conductive pads 309a-309n. Conductive plane 313 is electrically connected with the conductive structures 301. In IC testing system 300, each conductive structure 301 is tested by causing a voltage to be supplied to at least one of the conductive structures 301 by a respective test circuit 305 to determine if the conductive structure 301 having the voltage supplied to the conductive structure 301 is capable of carrying the voltage supplied to that conductive structure 301. Controller 317 is configured to selectively cause the test circuits 305 to supply the voltage to the conductive structures 301. In some embodiments, the controller 317 is configured to cause only one of the test circuits 305 to supply the test voltage at a time. In some embodiments, the controller 317 is configured to selectively cause the test circuits 305 sequentially supply the test voltage in order so as to individually test each conductive structure 301 included in the grid array.

Figure 4:
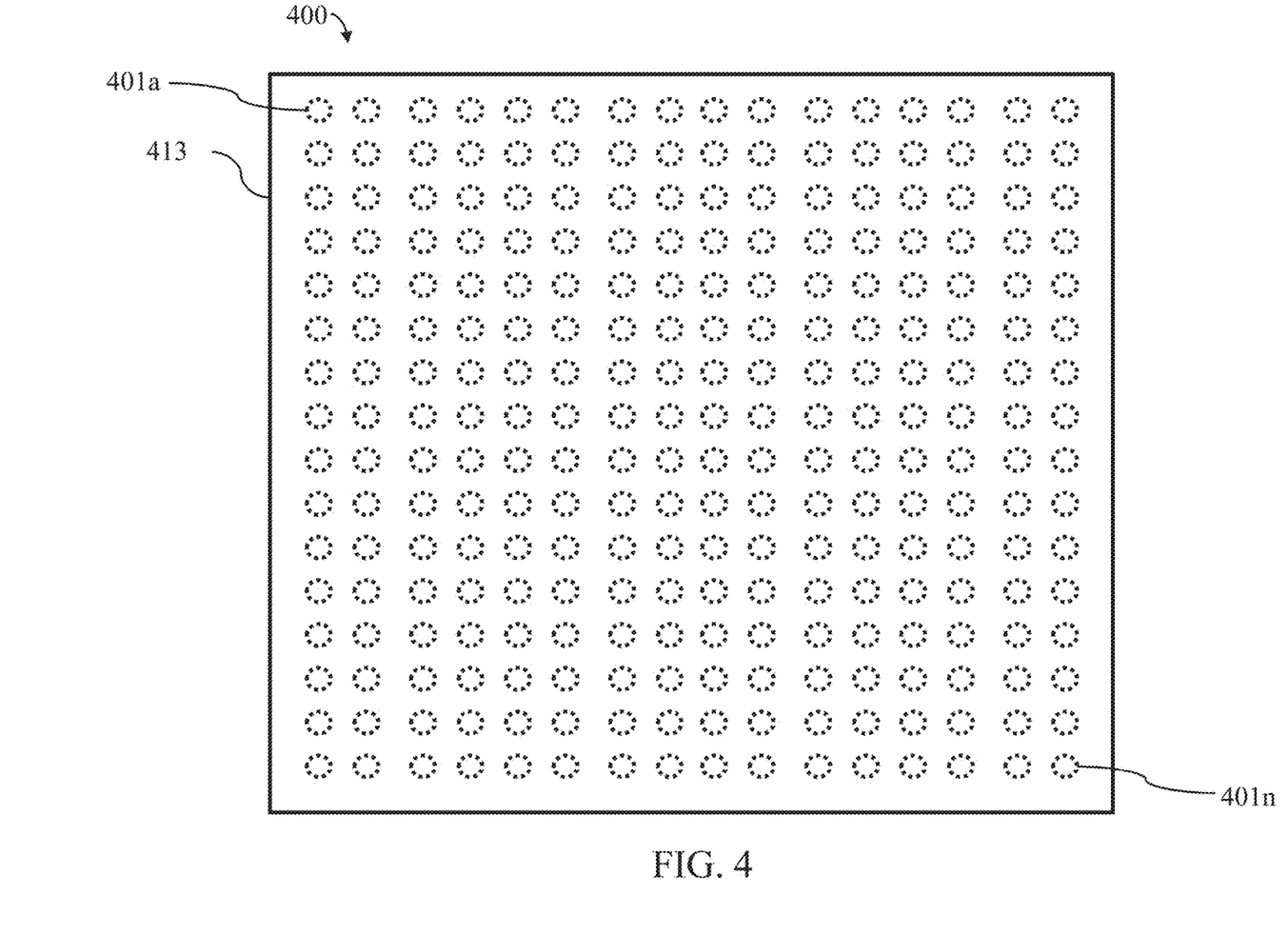
FIG. 4 is a top-side view of an IC testing system, in accordance with one or more embodiments.

FIG. 4 is a top-side view of an IC testing system 400, in accordance with one or more embodiments. IC testing system 400 comprises many of the features discussed with respect to IC testing system 100 (FIG. 1), with the reference numerals increased by 300. IC testing system 400 includes conductive structures 401a-401n arranged in a grid array. Conductive plane 413 is continuous over all of the conductive structures 401a-401n and contacts all of the conductive structures 401a-401n.

Figure 5:
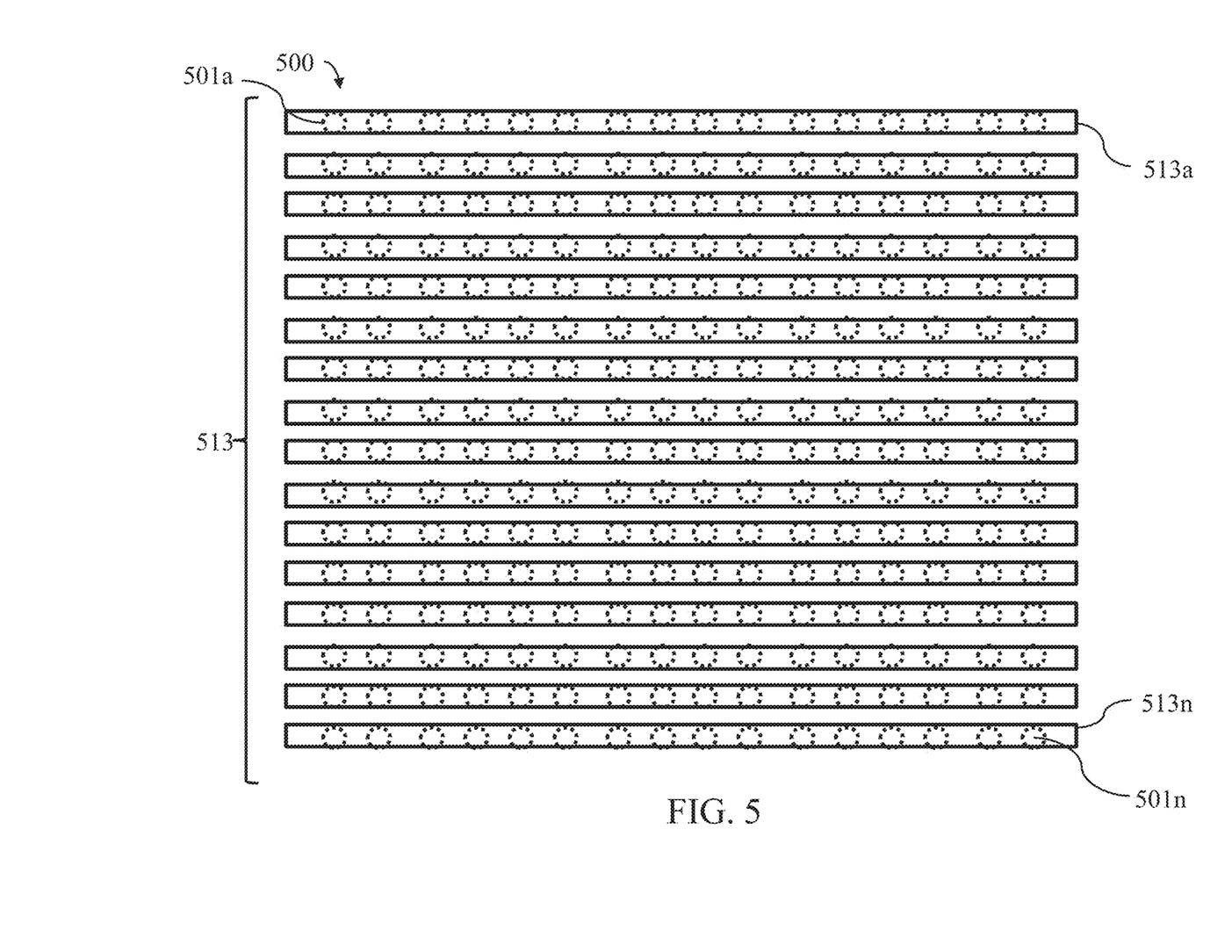
FIG. 5 is a top-side view of an IC testing system, in accordance with one or more embodiments.

FIG. 5 is a top-side view of an IC testing system 500, in accordance with one or more embodiments. IC testing system 500 comprises features similar to those discussed with respect to IC testing system 400 (FIG. 4), with the reference numerals increased by 100. IC testing system 500 differs from IC testing system 400 in that IC testing system 500 includes a conductive plane 513 that comprises a plurality of separate sub-planes 513a-513n (collectively referred to as sub-planes 513). Sub-planes 513 each extend across the grid array and contact conductive structures 501 that are each arranged in a single row of the grid array.

Figure 6:
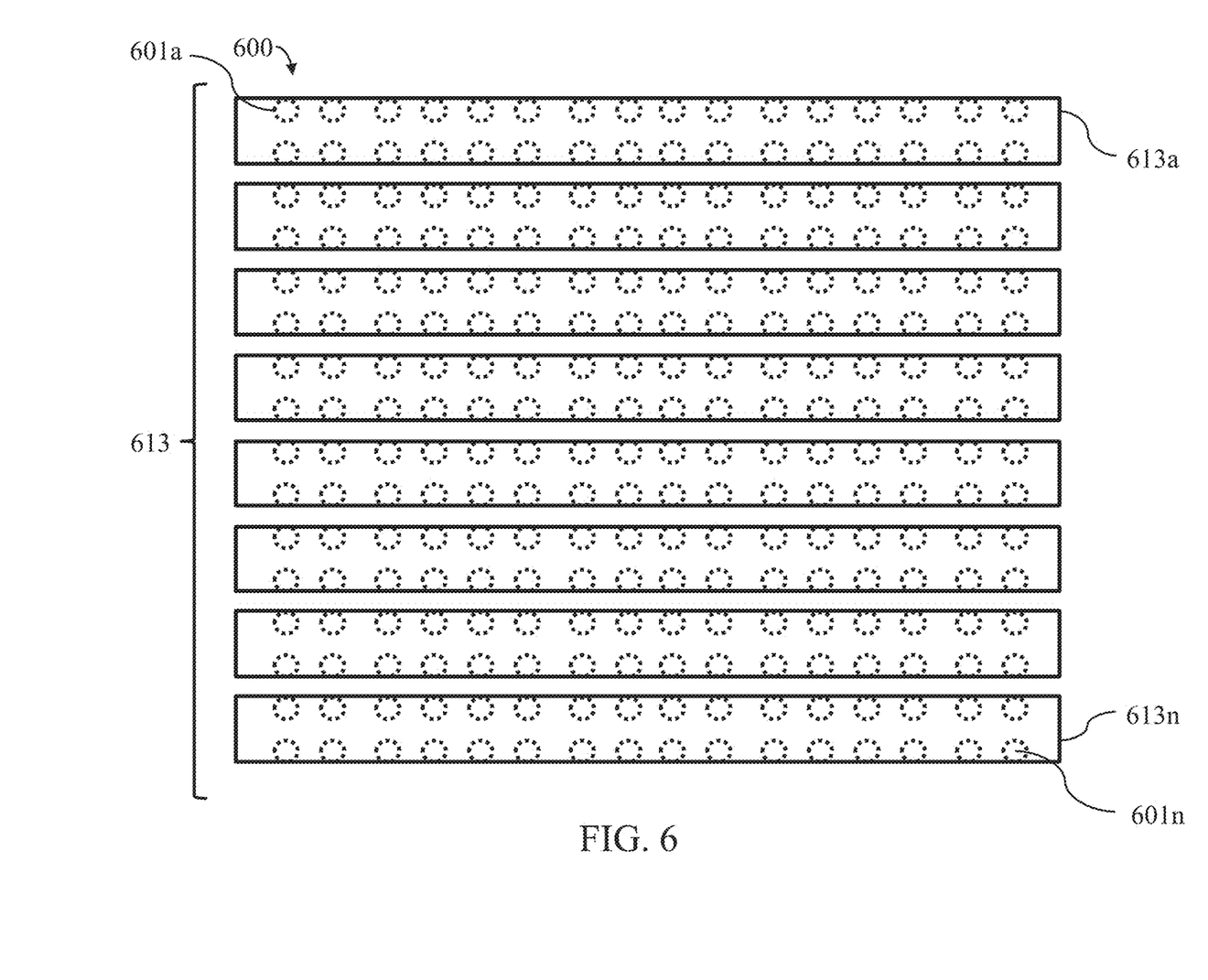
FIG. 6 is a top-side view of an IC testing system, in accordance with one or more embodiments.

FIG. 6 is a top-side view of an IC testing system 600, in accordance with one or more embodiments. IC testing system 600 comprises features similar to those discussed with respect to IC testing system 500 (FIG. 5), with the reference numerals increased by 100. IC testing system 600 differs from IC testing system 500 in that IC testing system 600 includes a conductive plane 613 that comprises sub-planes 613a-613n that each extend across the grid array and contact conductive structures 601 that are each arranged in multiple rows of the grid array. While the sub-planes 613a-613n are illustrated as each contacting conductive structures 601 in two rows of the grid array, different embodiments of the IC testing system 600 include sub-planes 613a-613n that contact more than two rows of conductive structures 601. In some embodiments, all of the sub-planes 613a-613n are configured to contact an equal number of rows of conductive structures 601. In some embodiments, IC testing system 600 includes one or more sub-planes 613a-613n that are configured to contact different quantities of rows of conductive structures 601. In some embodiments, at least one of the sub-planes 613a-613n is configured to contact one row of conductive structures 601 and the other of the sub-planes 613a-613n are configured to contact more than one row of conductive structures 601.

Figure 7:
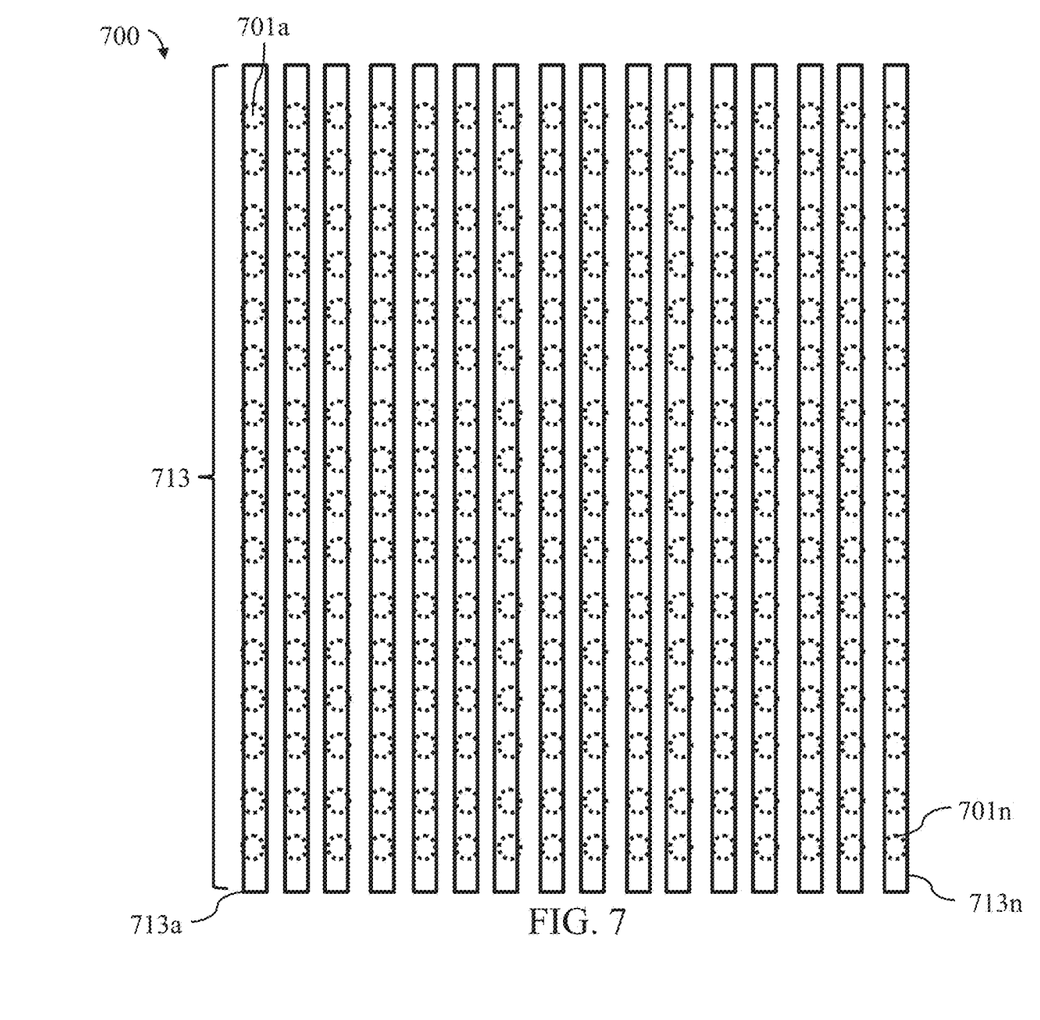
FIG. 7 is a top-side view of an IC testing system, in accordance with one or more embodiments.

FIG. 7 is a top-side view of an IC testing system 700, in accordance with one or more embodiments. IC testing system 700 comprises features similar to those discussed with respect to IC testing system 400 (FIG. 4), with the reference numerals increased by 300. IC testing system 700 differs from IC testing system 400 in that IC testing system 700 includes a conductive plane 713 that comprises a plurality of separate sub-planes 713a-713n. Sub-planes 713a-713n each extend across the grid array and contact conductive structures 701 that are each arranged in a single column of the grid array.

Figure 8:
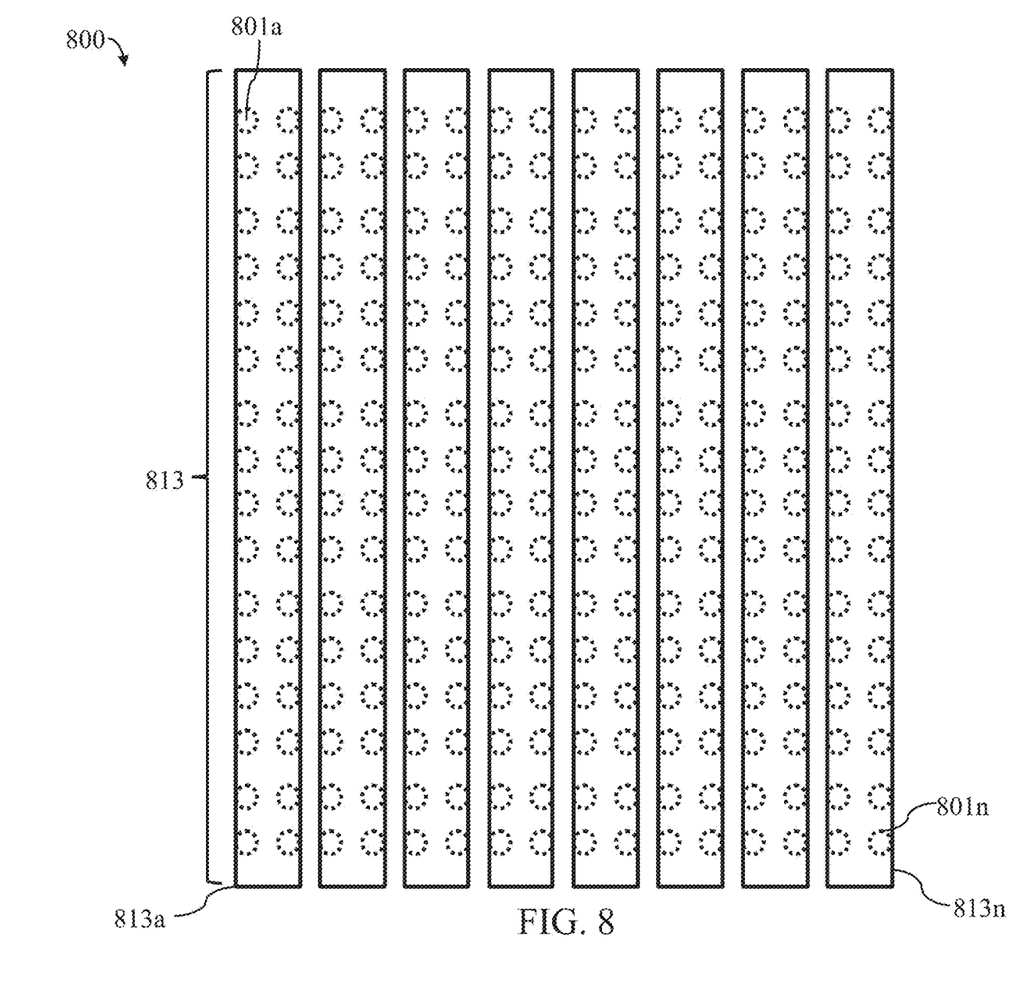
FIG. 8 is a top-side view of an IC testing system, in accordance with one or more embodiments.

FIG. 8 is a top-side view of an IC testing system 800, in accordance with one or more embodiments. IC testing system 800 comprises features similar to those discussed with respect to IC testing system 700 (FIG. 7), with the reference numerals increased by 100. IC testing system 800 differs from IC testing system 700 in that IC testing system 800 includes a conductive plane 813 that comprises sub-planes 813a-813n that each extend across the grid array and contact conductive structures 801 that are each arranged in multiple columns of the grid array. While the sub-planes 813a-813n are illustrated as each contacting conductive structures 801 in two columns of the grid array, different embodiments of the IC testing system 800 include sub-planes 813a-813n that contact more than two columns of conductive structures 801. In some embodiments, all of the sub-planes 813a-813n are configured to contact an equal number of columns of conductive structures 801. In some embodiments, IC testing system 800 includes one or more sub-planes 813a-813n that are configured to contact different quantities of columns of conductive structures 801. In some embodiments, at least one of the sub-planes 813a-813n is configured to contact one column of conductive structures 801 and the other of the sub-planes 813a-813n are configured to contact more than one column of conductive structures 801.

Figure 9:
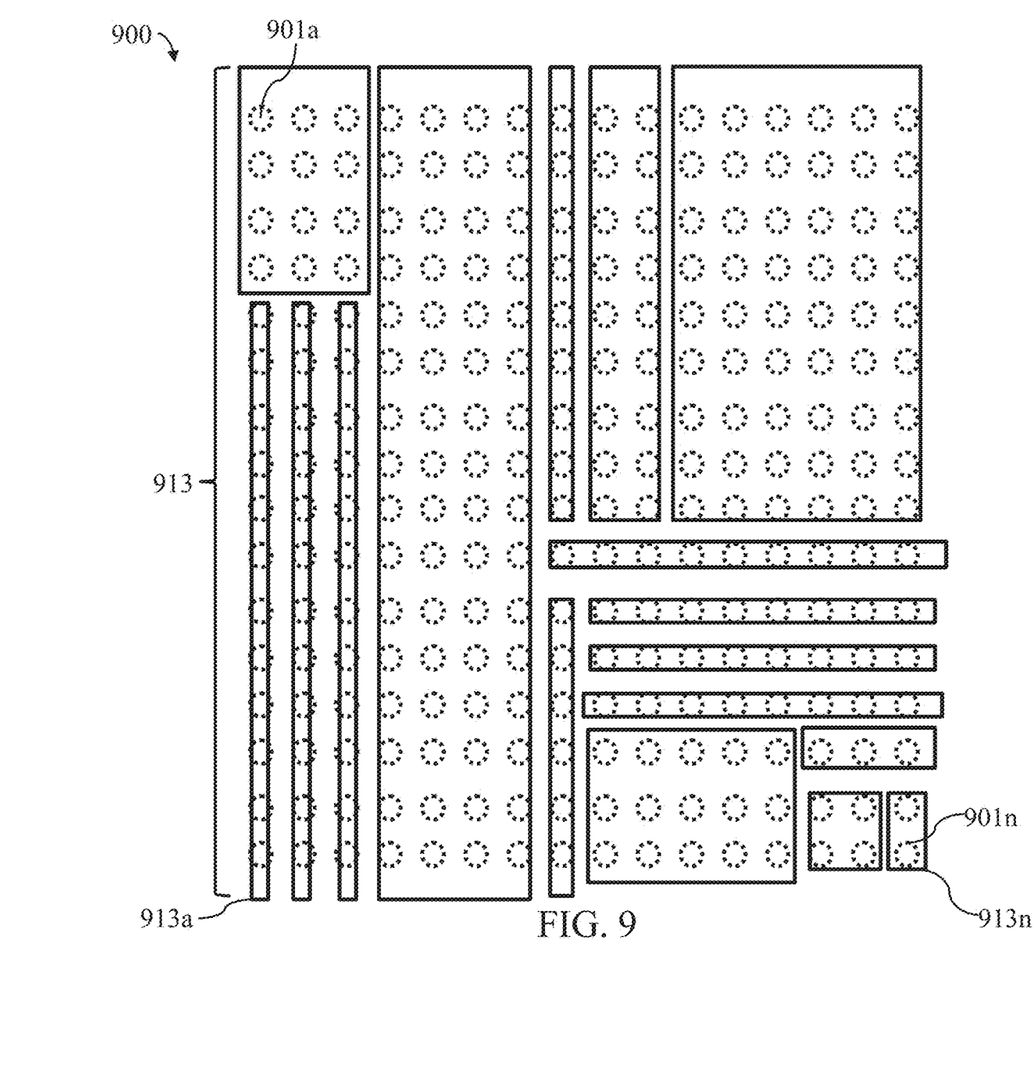
FIG. 9 is a top-side view of an IC testing system, in accordance with one or more embodiments.

FIG. 9 is a top-side view of an IC testing system 900, in accordance with one or more embodiments. IC testing system 900 comprises features similar to those discussed with respect to IC testing system 400 (FIG. 4), with the reference numerals increased by 500. IC testing system 900 differs from IC testing system 400 in that IC testing system 900 includes a conductive plane 913 that comprises a plurality of separate sub-planes 913a-913n. Sub-planes 913a-913n each contact various quantities of conductive structures 901 that are each arranged in columns and/or rows of the grid array.

Figure 10:
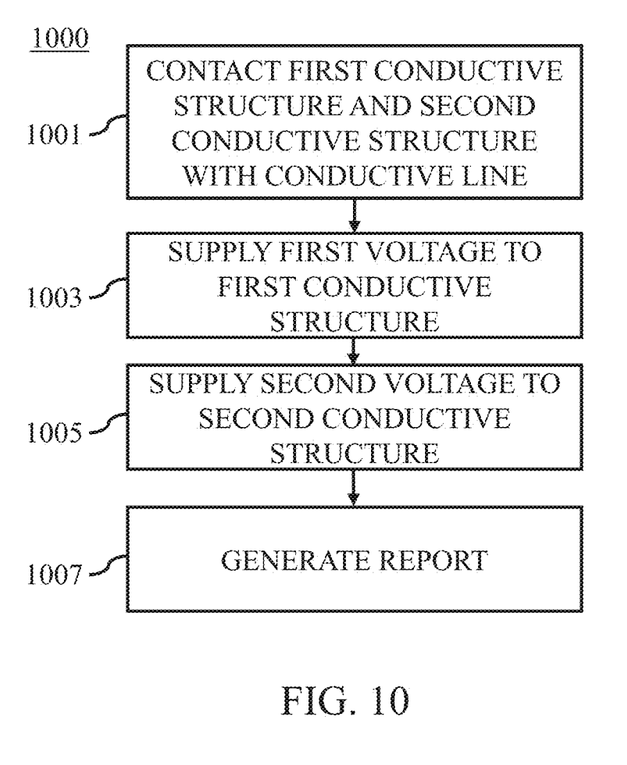
FIG. 10 is a flowchart of a method of testing an IC, in accordance with one or more embodiments.

FIG. 10 is a flowchart of a method 1000 of testing an IC, in accordance with one or more embodiments. Method 1000 is usable to determine if one or more conductive structures included in an IC are capable of carrying a voltage supplied to the conductive structures. In some embodiments, method 1000 is usable to determine if one or more conductive structures included in an IC are capable of carrying a voltage supplied to the conductive structures without the use of a test pin. In step 1001, a first conductive structure such as conductive structure 105a (FIG. 2) and a second conductive structure such as conductive structure 105b are caused to be electrically connected to a conductive line. In step 1003, a first voltage such as voltage V1a (FIG. 2) is supplied to the first conductive structure to determine if the first conductive structure is capable of carrying the first voltage. In step 1005, a second voltage such as voltage V1b is supplied to the second conductive structure to determine if the second conductive structure is capable of carrying the second voltage. In step 1007, a report is generated indicating whether one or more of the first conductive structure or the second conductive structure is incapable of carrying the first voltage or the second voltage based on feedback received from the one or more test circuits. In some embodiments, a report is generated indicating whether one or more of the first conductive structure or the second conductive structure is capable of carrying the first voltage or the second voltage based on feedback received from one or more test circuits individually coupled with the first conductive structure and the second conductive structure. In some embodiments, a report is generated indicating whether one of the first conductive structure or the second conductive structure is capable of carrying the first voltage or the second voltage and the other of the first conductive structure or the second conductive structure is incapable of carrying the first voltage or the second voltage based on feedback received from the one or more test circuits. In some embodiments, a controller causes the first voltage to be supplied to the first conductive structure at a time before the controller causes the second voltage to be supplied to the second conductive structure. In some embodiments the controller causes only one of the first voltage to be supplied to the first conductive structure or the second voltage to be supplied to the second conductive structure at a time.

An aspect of this description is related to an integrated circuit testing system that includes a conductive line connected to a node configured to have a ground voltage. A plurality of conductive structures are coupled to the conductive line. A plurality of test circuits each is configured to supply a test voltage individually to a different conductive structure of the plurality of conductive structures for testing electrical connectivity of each of the different conductive structures. The conductive line is positioned between the node and the test circuits of the plurality of test circuits. A controller is coupled to each of the test circuits of the plurality of test circuits. The controller is configured to cause each of the test circuits of the plurality of test circuits to individually supply the test voltage to each of the different conductive structures of the plurality of conductive structures.

Another aspect of this description is related to an integrated circuit testing system that includes a plurality of conductive structures coupled to a conductive line. A plurality of test circuits each individually is coupled to a different conductive structure of the plurality of conductive structures. Each of the test circuits is configured to send a feedback indicative of whether each of the different conductive structures is capable of carrying a test voltage individually supplied by each of the test circuits. A controller is coupled to each of the test circuits of the plurality of test circuits. The controller is configured to collect connectivity information about each of the test circuits of the plurality of test circuits. The controller generates a report indicating electrical connectivity of the conductive structures.

A further aspect of this description is related to a method of testing an integrated circuit. The method includes coupling a plurality of conductive structures to a conductive line, and individually coupling each of a plurality of test circuits to a different one of the plurality of conductive structures. Moreover, the method includes supplying a test voltage individually from each of the test circuits of the plurality of test circuits to each of the different ones of the plurality of conductive structures, and each of the test circuits of the plurality of test circuits issues a feedback indicative of whether each of the different ones of the plurality of conductive structures is capable of carrying the test voltage. Each of the test circuits is coupled to a controller. Furthermore, the method includes collecting the feedback from each of the test circuits of the plurality of test circuits indicating whether each of the different ones of the plurality of conductive structures is capable of carrying the test voltage, and generating a report indicating a status of electrical connectivity of the conductive structures of the plurality of conductive structures with the conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit testing system comprising:
   a conductive line connected to a node configured to have a ground voltage;
   a plurality of conductive structures, wherein at least one conductive structure of the plurality of conductive structures is in direct physical contact with the conductive line;
   a plurality of test circuits each configured to supply a test voltage individually to a different conductive structure of the plurality of conductive structures for testing electrical connectivity of each of the different conductive structures, wherein the conductive line is positioned between the node and the test circuits of the plurality of test circuits; and
   a controller coupled to each of the test circuits of the plurality of test circuits, the controller configured to cause each of the test circuits of the plurality of test circuits to individually supply the test voltage to each of the different conductive structures of the plurality of conductive structures.

2. The integrated circuit testing system of claim 1, further comprising a plurality of conductive pads, and wherein the conductive structures of the plurality of conductive structures are each coupled to the test circuits of the plurality of test circuits by at least one conductive pad of the plurality of conductive pads.

3. The integrated circuit testing system of claim 1, wherein each of the test circuits of the plurality of test circuits comprises an enabling circuit configured to supply the test voltage.

4. The integrated circuit testing system of claim 3, wherein each of the test circuits of the plurality of test circuits further comprises a measurement circuit coupled to the enabling circuit, the measurement circuit configured to generate an indication that one conductive structure from the plurality of conductive structures is electrically connected with the conductive line.

5. The integrated circuit testing system of claim 4, wherein the measurement circuit is configured to detect current flow indicative that a conductive structure of the plurality of conductive structures is electrically coupled to a conductive pad of the plurality of conductive pads.

6. The integrated circuit testing system of claim 4, wherein the measurement circuit is configured to generate an indication that the one conductive structure of the plurality of conductive structures is electrically connected with the one conductive pad of the plurality of conductive pads based on the current flow.

7. The integrated circuit testing system of claim 1, wherein the test voltage of each of the test circuits is adjustable.

8. The integrated circuit testing system of claim 1, wherein the controller is configured to cause each of the test circuits of the plurality of test circuits to supply the test voltage in a sequential order.

9. The integrated circuit testing system of claim 1, wherein the controller is configured to cause one test circuit of the plurality of test circuits to supply the test voltage.

10. The integrated circuit testing system of claim 1, wherein a first test circuit of the plurality of test circuits is configured to provide a first test voltage to a first conductive structure of the plurality of conductive structures, a second test circuit of the plurality of test circuits is configured to provide a second test voltage to a second conductive structure of the plurality of conductive structures, and the first test voltage is different from the second test voltage.

11. The integrated circuit testing system of claim 1, further comprising a second conductive line, wherein the second conductive line is physically separated from the conductive line, the second conductive line is electrically connected to a first conductive structure of the plurality of conductive structures, and the first conductive structure is physically separated from the conductive line.

12. An integrated circuit testing system comprising:
a plurality of conductive structures coupled to a conductive line;
a plurality of test circuits each individually coupled to a different conductive structure of the plurality of conductive structures, each of the test circuits configured to send a feedback indicative of whether each of the different conductive structures is capable of carrying a test voltage individually supplied by each of the test circuits;
a controller coupled to each of the test circuits of the plurality of test circuits, the controller configured to collect connectivity information about each of the test circuits of the plurality of test circuits, wherein the controller generates a report indicating electrical connectivity of the conductive structures; and
a plurality of readout circuits, wherein each readout circuit of the plurality of readout circuits is configured to receive the feedback and to provide the connectivity information to the controller, and each of the plurality of readout circuits is electrically connected in series between a corresponding test circuit of the plurality of test circuits and the controller.

13. The integrated circuit testing system of claim 12, wherein each of the test circuits of the plurality of test circuits is configured to detect a current flow from a voltage supply to one conductive structure of the plurality of conductive structures.

14. The integrated circuit testing system of claim 12, wherein the electrical connectivity is established for one test circuit of the plurality of test circuits coupled to one conductive structure of the plurality of conductive structures when current flow through the one conductive structure of the plurality of conductive structures and the conductive line is detected by the one test circuit of the plurality of test circuits.

15. The integrated circuit testing system of claim 12, wherein each of the plurality of readout circuits is configured to determine if each of the different conductive structures of the plurality of conductive structures are each capable of carrying the test voltage individually supplied by each of the test circuits.

16. The integrated circuit testing system of claim 15, wherein each of the plurality of readout circuits is configured to determine if each of the different conductive structures from the plurality of conductive structures is capable of carrying a test voltage individually supplied by each of the test circuits based on the feedback and communicate the determination to the controller.

17. The integrated circuit testing system of claim 12, wherein the conductive structures of the plurality of conductive structures comprise different conductive materials.

18. The integrated circuit testing system of claim 12, wherein the report indicates at least one of the conductive structures is capable of carrying the test voltage.

19. A method of testing an integrated circuit, the method comprising:
coupling a plurality of conductive structures to a conductive line;
individually coupling each of a plurality of test circuits to a different one of the plurality of conductive structures;
supplying a test voltage individually from each of the test circuits of the plurality of test circuits to each of the different ones of the plurality of conductive structures, and each of the test circuits of the plurality of test circuits issues a feedback indicative of whether each of the different ones of the plurality of conductive structures is capable of carrying the test voltage, wherein a first test voltage from a first test circuit of the plurality of test circuits is different from a second test voltage from a second test circuit of the plurality of test circuits;
coupling each of the test circuits to a controller;
collecting the feedback from each of the test circuits of the plurality of test circuits indicating whether each of the different ones of the plurality of conductive structures is capable of carrying the test voltage; and
generating a report indicating a status of electrical connectivity of the conductive structures of the plurality of conductive structures with the conductive line.

20. The method of claim 19, wherein the generating the report comprises indicating the status of electrical connectivity of at least one of the conductive structures of the plurality of conductive structures being capable of carrying the test voltage.

* * * * *